US006349272B1

(12) United States Patent
Phillips

(10) Patent No.: US 6,349,272 B1
(45) Date of Patent: Feb. 19, 2002

(54) METHOD AND SYSTEM FOR MODELING TIME-VARYING SYSTEMS AND NON-LINEAR SYSTEMS

(75) Inventor: Joel Phillips, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/545,537

(22) Filed: Apr. 7, 2000

Related U.S. Application Data

(60) Provisional application No. 60/128,216, filed on Apr. 7, 1999.

(51) Int. Cl.⁷ .......................... G06G 17/50; G06G 7/16; G06G 17/10
(52) U.S. Cl. ............................................. 703/2; 703/14
(58) Field of Search ....................... 703/2, 14

(56) References Cited

U.S. PATENT DOCUMENTS

| | | | | |
|---|---|---|---|---|
| 5,689,685 A | * | 11/1997 | Feldmann et al. | 395/500 |
| 5,808,915 A | * | 9/1998 | Troyanovsky | 364/578 |
| 5,920,484 A | * | 7/1999 | Nguyen et al. | 703/2 |
| 6,115,670 A | * | 9/2000 | Druskin et al. | 702/7 |
| 6,151,698 A | * | 11/2000 | Telichevesky et al. | 716/1 |
| 6,188,974 B1 | * | 2/2001 | Cullum et al. | 703/14 |

OTHER PUBLICATIONS

"Simulation of multiconductor transmission lines using Krylov subspace order–reduction techniques", Celik et al., 1997 IEEE.*
"Model reduction of time varying linear system using approximate multipoint Krylov–subspace projectors", Phillips, 1998 IEEE.*
"Krylov subspace based model order reduction techniques for circuit simulators", Beyene et al., 1996 IEEE.*
"Recent advances in Krylov subspace solvers for linear systems and applications in device simulation", Coughran et al., 1997 IEEE.*
"A General minimal residual Krylov subspace method for large–scale model reduction", Jaimoukha, 1997 IEEE.*
"Efficient time–domain and frequency domain finite element solution for Maxwell's equations using spectral Lanczos decomposition method", Zunoubi et al., 1998 IEEE.*
"Iterative solution of linear systems in harmonic balance analysis", Gourary et al., 1997 IEEE.*
"Efficient frequency domain analysis of large nonlinear analog circuits", Feldmann et al., 1996 IEEE.*
"Stabliity criteria for Arnoldi–based model order reduction", Elfadel et al., 1996 IEEE.*
"Efficient reduced order modeling of frequency dependent coupling inductances associated with 3–D interconnect structures", Silveira et al., 1996 IEEE.*
"Efficient simulation of high–speed distributed interconnects using Kylov–subspace techniques", Gunupudi et al., 1998 IEEE.*

* cited by examiner

Primary Examiner—Kevin J. Teska
Assistant Examiner—William Thomson
(74) Attorney, Agent, or Firm—Crosby, Heafey, Roach & May

(57) ABSTRACT

A method and system for generating reduced models of systems having a time-varying elements, a non-linear elements or both is provided. The system and method can be utilized with any systems that are capable of being described with non-linear or time-varying differential equations. The method and system are especially useful for automated extraction of reduced models for nonlinear RF blocks, such as mixers and filters, that have a near linear signal path but may contain strongly nonlinear time-varying components. The models have the accuracy of a transistor level nonlinear simulation but are very compact and so can be used in system level simulation and design.

23 Claims, 9 Drawing Sheets

METHOD AND SYSTEM FOR MODELING TIME-VARYING SYSTEMS AND NON-LINEAR SYSTEMS

CROSS REFERENCE TO RELATED APPLICATIONS

This application claims priority from U.S. Provisional Patent Application Ser. No. 60/128,216, entitled Model Reduction Of Time-Varying Linear Systems Using Approximate Multipoint Krylov-subspace Projectors, filed Apr. 7, 1999, which is incorporated herein by reference in its entirety.

BACKGROUND

1. Field of the Invention

The present invention relates generally to modeling systems having time varying elements, non-linear elements, or both types of elements and amongst other things to a method and system for generating reduced order models capable of being used in simulation of systems having time varying elements, non-linear elements, or both types of elements.

2. Background of the Invention

The increasing size, complexity, and integration level of wireless communications circuits makes accurate simulation of system level performance problematic. A challenging problem in the area of analog circuits is the simulation of clocked analog circuits like switching filters, switching power supplies, and phase-locked loops. These circuits are computationally expensive to simulate using conventional techniques because these kinds of circuits are all clocked at a frequency whose period is orders of magnitude smaller than the time interval of interest to the designer. Further, radio frequency circuits, mixed signal operation circuits and the like require modeling of not only analog circuits but the interaction of analog and digital circuits as systems and the interaction between the analog and digital circuits. These products require complex system-on-chip design and system integration, delivered in the tight and unforgiving time frames inherent to consumer markets. The realities of consumer-driven chip design and deployment are driving key considerations for designers, such considerations include that: (1) design costs and time are likely to dominate the decision-making process for system designers; (2) designs must be captured at the highest level of abstraction possible; (3) next-generation systems will need more medium-complexity systems than highly complex part types; and (4) chips will most likely be developed particular for platforms rather than being assembled from independently developed blocks of silicon functionality.

Model reduction refers to the procedure of automatic generation of system macromodels from detailed descriptions of circuits or systems. These macromodels can be used to perform rapid system level simulation of engineering designs that are too complicated to analyze at the detailed component level. The advantage of the reduction approach is that because the macromodels are generated from detailed physical descriptions of the system components, the influence of detailed physical effects can be included at the system level. Thus, an essential feature of reduction approaches is thorough control and assessment of approximation errors from formal analysis of the reduction algorithms. The problem of automated macromodel generation is interesting from the viewpoint of system level design because if small, accurate reduced order models of system component blocks can be extracted, then much larger portions of a design, or more complicated systems, can be simulated or verified than if the analysis were to have to proceeded at a detailed level. The prospect of generating the reduced model from a detailed analysis of component blocks is attractive because the influence of second order device effects or parasitic components on the overall system performance can be assessed. In this way overly conservative design specifications can be avoided.

There has been considerable recent interest, primarily in the context of simulation of electrical interconnect, in extracting low order models of lumped (often passive) components that are time invariant. There are many systems, however, that are not linear time-invariant (LTI) but can be accurately modeled as linear time varying (LTV). For example, if a nonlinear circuit model is linearized around a time-varying large signal, the resulting model is linear time-varying. In particular, many RF components (e.g., mixers and filters) are designed to have a near linear response in the signal path, but may have strongly nonlinear response to other excitations, such as the clock of a switched capacitor filter, or a mixer's local oscillator. RF circuits, which have a fundamental period, can be further classified as periodic time varying linear (PTVL) systems. Such components are prime candidates for LTV model reduction. From the above description, it can be seen that in the real world, the set of circuits that can be accurately modeled as LTV is much larger than the set that can be described as LTI.

Most of the recent work on LTI model reduction has been based, implicitly or explicitly, on projection-based formulations. The reduced model is obtained from the full model by projecting the linear system into a subspace of lower dimension. The subspace chosen determines the approximation properties of the reduced model.

It is now generally accepted that in LTI systems, choosing the projection subspaces to be Krylov subspaces is effective and efficient. The efficiency arises because the Krylov subspaces are easily computed. The effectiveness of the approach is motivated by noting that projecting into a Krylov subspace corresponds to matching derivatives of the Laplace-domain transfer function (the moments). Methods based on multipoint rational approximations are known to be particularly efficient. Unfortunately, however, model reduction for time-varying systems appears to have received little attention. Balanced truncation approaches have been proposed, but it is unclear how to implement these techniques effectively.

An additional problem in circuit design includes the modeling of interconnect and parasitic effects that are pervasive in all types of designs including digital, analog, and mixed signal designs. The computational cost due to the size and complexity of these circuit models is a major bottleneck in the verification of these designs. Therefore, a technique to provide accurate and compact macromodels of these interconnect and parasitic effects in circuits will improve upon the overall design cycle time.

Two recent trends in integrated circuit designs have brought out the importance of interconnect and parasitic effects in design verification: the evolution towards submicron designs and the rapid growth of telecommunication/RF circuit designs. The combination of high frequencies and high packaging densities in these designs has quickly increased the size as well as the complexity of the circuit models for circuit simulation and timing verification. Therefore, there is a need for a general tool to provide accurate and compact reduced order macromodeling of these linear circuit models to significantly improve the throughput of circuit simulation as well as timing verification, which in turn will improve the total design cycle time.

Presently, algorithms for reduction of large-scale linear systems have been projection-based approaches. Algorithms such as PVL, Arnoldi methods, and PRIMA obtain reduced models by projecting the linear equations describing the LTI model system into a subspace of lower dimension. The subspace chosen determines the approximation properties of the reduced model. Most of the popular algorithms exploit the connection between Krylov subspaces and rational approximation to develop algorithms that have a known relationship to the frequency-domain characteristics of the system, for example, matching the transfer function and some of its derivatives at various points in the complex plane. Linear reduction algorithms are useful for many problems, for example, simulation of electrical interconnect and analysis of noise in RF systems, but fail totally in other contexts. For example, adjacent channel power ratio "ACPR" is a figure of merit for the distortion properties of digitally modulated RF transmission systems and therefore by definition requires the utilization of nonlinear models. Microelectromechanical systems ("MEMS") and power systems also require nonlinear macromodeling approaches. However, very few results are available for reduction of nonlinear systems.

SUMMARY OF THE INVENTION

In one embodiment, the present invention is directed toward a method for model reduction of systems that have time varying elements, which can be described by time varying differential equations. This method allows for automated extraction reduction reduced models for non-linear RF blocks, such as mixers and filters, that have a near linear signal path but may have strongly non-linear responses.

In another embodiment, the present invention is directed toward a method for model reduction of systems that have non-linear elements, which can be described by non-linear differential equations.

In a further embodiments, the present invention is directed toward a method for model reduction of systems that have non-linear and time varying elements, which can be described by time-varying non-linear differential equations.

DESCRIPTION OF THE DRAWINGS

Figure 1:
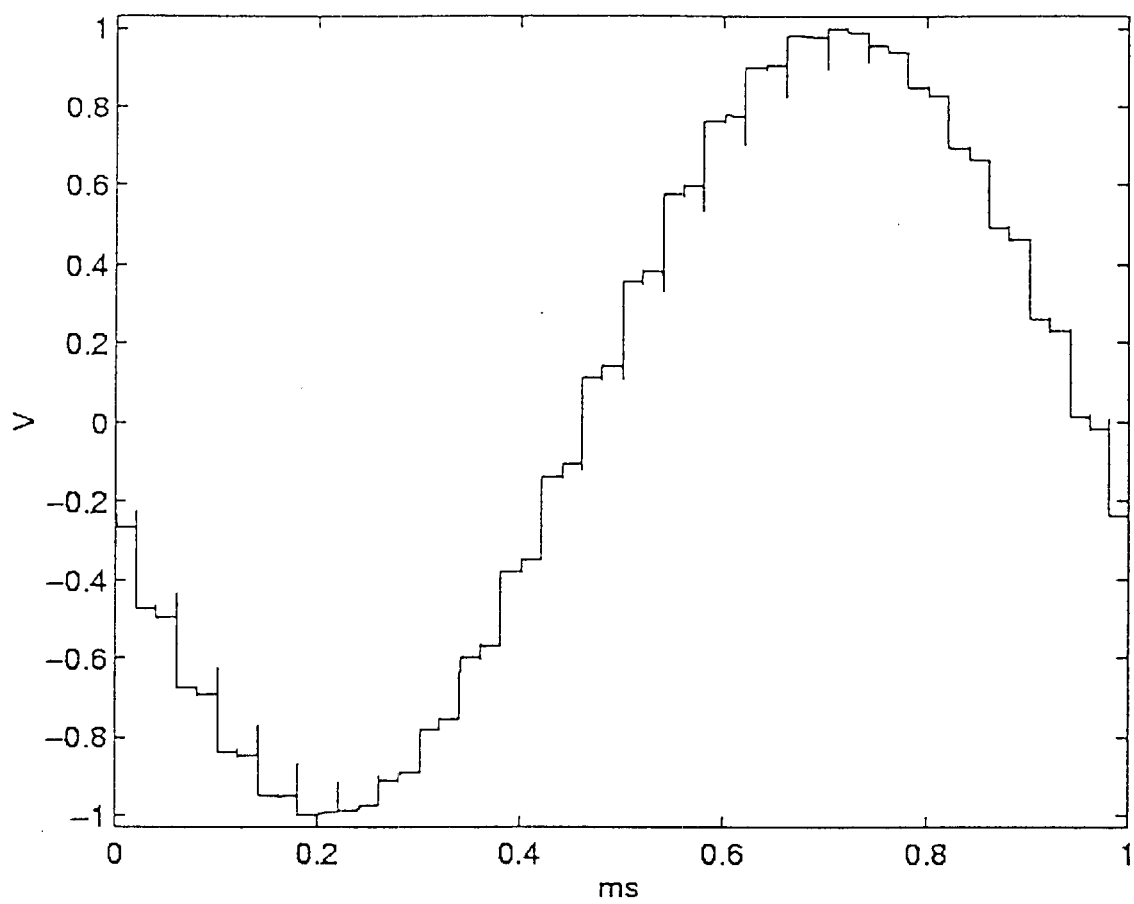
FIG. 1 is a response of a switched capacitor filter to a 1 KHz sinusoid utilizing known model reduction techniques.

Krylov—subspace based projection methods generally operate as follows. Consider the linear time-invariant multi-input, multi-output (MIMO) linear system written in differential-algebraic form.

$$C\dot{x}(t) = -Gx + Bu(t)$$

$$y(t) = D^T x$$

where $C, G \in R^{n \times n}$; $x(t) \in R^n$, $B \in R^{n \times n_i}$, $D \in R^{n \times n_o}$, $u(t) \in R^{n_o}$, $y(t) \in R^{n_o}$, n is the system order, and $n_i$ and $n_o$ are the number of system inputs and outputs respectively.

For purposes of simplification, let C=I where I is the identity matrix. After performing a Laplace transformation, the system output is $y(s) = D^T (sI+G)^{-1} Bu(s)$. The transfer function $D^T (sI+G)^{-1} B$ is a rational function in s and can be approximated with a rational function, such as a Padé approximant. Padé approximants, like most other approximants used for model reduction, have the property of matching the transfer function and some of its derivatives with respect to S.

In the general case a rational approximant can be obtained by $$\hat{C}\dot{z}(t) = -\hat{G}z + \hat{B}u(t)$$

$$y(t) = \hat{D}^T z$$

where $\hat{C}, \hat{G} \in R^{r \times r}$; $z(t) \in R^r$, $\hat{B} \in R^{r \times n_i}$, $\hat{D} \in R^{r \times n_o}$ and r<<<n if the reduction is useful. The reduced matrices are obtained from the projection matrices L and T by $$\hat{G} = L^T GT, \hat{C} = L^T CT, \hat{B} = L^T B, \hat{D} = T^T D \qquad (1)$$

Returning to the case C=I (the following results generalize), note that the kth derivative, or moment, of the transfer function is given by $D^T G^{-(k+1)} B$. Clearly the approximants to be generated are connected with powers of the matrix $G^{-1}$ acting on B, or of $G^{-T}$ acting on D. Connecting the moments to the projection matrices L, T is the key to the model reduction procedure. The following definition and theorem formalize these ideas.

Definition 1 (Krylov Subspace)

The Krylov subspace $K_m(A,p)$ generated by a matrix A and vector p, of order m, is the space spanned by the set of vectors $\{p, Ap, A^2p, \ldots, A^{m-1}p\}$.

Theorem 1 (Krylov Subspace Approximation)

If the columns of L span the order m Krylov subspace $K_m(G^{-T}, D)$ and the columns of T span the order n Krylov subspace $K_m(G^{-1}, B)$, then the reduced order transfer function $\hat{D}T(sI+\hat{G})^{-1}B$ matches the first m+n moments of the unreduced function $D^T(sI+G)^{-1}B$.

For example, in the PVL algorithm, which forms a Padé approximation and is thus equivalent to the AWE technique because of the relation between the Lanczos algorithm and Padé approximants, the choice of L and T is $L^T = W^T G^{-1}$, T=V, where W and V contain the biorthogonal Lanczos vectors, and in one variant of model reduction based on the Arnoldi method, $L^T = W^T G^{-1}$, T=V, where V is the orthonormal matrix generated by the Arnoldi process. The columns of W span $K_m(G^{-T}, D)$ and the columns of V span $K_m(G^{-1}, B)$.

It is known to take the projection matrices directly from the Krylov basis itself, L=T=V. Because of the orthogonal projection, if the full model possesses desirable structural properties, such as stability and passivity, the reduced models inherit them. It should be noted that although an orthogonal projection results whenever L=T, this result does indicate that L or T are orthogonal, though constructing L and/or T to have orthonormal columns can be useful from a computational standpoint.

This approach can be extended to the case of multipoint approximants where the transfer function and some of its derivatives are matched at several points in the complex plane. In this case L and T must contain a basis for the union of the Krylov subspaces constructed at the different expansion points. When the expansion point is complex, real models may be efficiently obtained by exploiting the fact that for a real matrix A, if $u=(I-sA)^{-1}p$ is in the Krylov space, then so is $u^*$.

1 Description of Linear Time Varying Systems

Linear time-varying systems occur in many situations. In the case of an electronic circuit, to obtain a linear time-varying circuit description, first the differential equations describing the circuit are written. The circuit description may be created using known techniques such as modified nodal analysis. This type of circuit description has the general form:

$$f(v^{(T)}) + \frac{d}{dt}q(v^{(T)}) = u^{(T)}(t) \quad (2)$$

where u represents the input sources, $v^{(T)}$ describes the node voltages, f is the relation between voltages and currents, and the function q relates voltages to charges (or fluxes). b is a vector that describes the mapping from the input function u to the system internals.

Equation 2 depicts the voltage v and input variable u with the superscript T to indicate that they are total quantities that can be split into two parts, a large-signal part and a small signal part, in order to obtain an LTV model, $$u^{(T)}=u^{(L)}+u, \quad v^{(T)}=v^{(L)}+v. \quad (3)$$

By linearizing around $v^{(L)}$, we obtain a linear time-varying system of the form $$G(t)v + \frac{d}{dt}(C(t)v) = bu(t) \quad (4)$$

where $G(t)=\partial f(v^{(L)})(t)/\partial v$ is the time-varying conductance and $C(t)=\partial f(v^{(L)})(t)/\partial v$ are the capacitance matrices, the small signal response v is obtained.

1.1. Analyzing the Linear Time-Varying System

In the following discussion the script (A) will be used to denote continuous operators and upper case (A) to denote a member of the space of n×n complex matrices, $M_n$. Subscripts will denote a vector or matrix variable at a particular time-point or harmonic frequency, and lower case un-subscripted variable will denote a variable over a time or frequency index. That is, for a system with N states represented with M (discrete) degrees of time-freedom (timepoints or Fourier harmonics), then $A \in M_{NM}$, $A_t \in M_N$, $x_t \in R^N$, $x \in R^{MN}$.

The formalism of Zadeh's variable transfer functions that were developed to describe time-varying systems is now preferably adopted to improve the model reduction process. However, while Zadeh's variable transfer functions are discussed below, this process can be performed with any frequency domain transfer functions. In this formalism the response v(t) can be written as an inverse Fourier transform of the product of a time-varying transfer function and the Fourier transform of u(t), u(w). That is, $$v(t)=\int_\infty^\infty h(i\omega',t)u(\omega')e^{i\omega' t}d\omega' \quad (5)$$

To obtain the frequency-by-frequency response, u is set to be a single-frequency input, $u_{\omega'}=u_\omega\delta(\omega-\omega')$, and from there it can be seen that $$v(t)=h(i\omega,t)u(\omega)e^{i\omega} \quad (6)$$

Writing s=iω and substituting this into Equation 4, an equation for the transfer function, h(s,t), is obtained, $$G(t)h(s,t) + \frac{d}{dt}(C(t)h(s,t)) + sC(t)h(s,t) = b \quad (7)$$

Defining $$K = G(t) + \frac{d}{dt}C(t)C = C(t) \quad (8)$$

this may be written more compactly as $$[K+sC]h(s,t)=b. \quad (9)$$

This expression may also be obtained from the finite difference formulations in the limit as the time step goes to zero, or from the multivariate partial differential equation formalism.

Equation 9 has a form similar to the frequency domain expressions of LTI transfer functions, e.g. $D^T(sI+G)^{-1}B$. However, it involves continuous operators instead of finite dimensional matrices. In general, since h(s,t) comes from a lumped linear system, it will be a rational function with an infinite number of poles. For example, in a periodically time varying system with fundamental frequency $\omega_0$, if η is a pole (in particular, a Floquet multiplier) of the system, then $\eta+k\omega_0$, k an integer, will be a pole of h(s, t). This is because signals can be converted by harmonic k in the time varying description from a frequency $\eta-k\omega_o$ to the pole at η.

1.2 Systems Concepts

The formalism described in Sections 1 and 1.1 completely describe the internal system response to an arbitrary outside input. However, all systems also interact with the external world, through both inputs and parasitic effects. Therefore, the detailed differential equation description of the internal system response needs to be related to outside systems. In the LTI context this role is played by the D and B matrices.

Time varying systems also differ from LTI systems in that there is considerable flexibility as to the choice of the possible input-output mapping functions, and thus of the transfer function itself. In the LTI case, the model ports are usually fixed in advance, and that results in input-output mapping functions that are fixed. Specification of a constant matrix pair (D, B) is sufficient to describe the input-output mappings. In the time-varying case, this is no longer sufficient. Therefore, in order describe the input-output mappings, D and B matrices or similarly functioning matrices should be specified.

However, since the system is an LTV system, it is useful to allow these matrices to vary with time. To see this, consider a switched capacitor filter. A five-pole low pass switched capacitor filter, containing 71 MOSFETs was simulated and the time varying linear response to a 1 kHz sinusoid computed. The results are shown in FIG. 1. The jagged waveform shape is a result of the strong non-linearity of the filter with respect to the clock. Incorporation of such effects is a goal of time varying modeling. An LTI system would produce a smooth sinusoid, shifted in phase and scaled in magnitude, as a response to this input. The output of the filter, however, is usually followed by some sort of function (e.g., the sample/hold of an A/D converter) that discards the filter output outside some small sample time window. To model this system at a higher level, a reduced order model that relates continuous, sinusoidal inputs to the window of output that the circuitry coupled to its output, e.g. the sample and hold, is desired.

In general, in the PTVL case, the D(t) and B(t) functions are preferably specified over a fundamental period. While this appears to allow for a great deal of freedom in selecting the D(t) and B(t) functions, there is not quite as much freedom as it first appears. In circuit problems, since the output ports are fixed, D(t) and B(t) may be written as $D(t)=D[d_1(t), \ldots, d_{n_i}(t)], B(t)=B[b_1(t), \ldots, b_{n_o}(t)]$ for some periodic scalar functions $d_i(t)$; $b_i(t)$. The presently preferred choice for TVL systems being, especially for most harmonic balance codes, that d(t); b(t) be single-tone sinusoids. In some cases, for example mixers, this is a natural choice, but in general cases, the choices of d(t); b(t) are not as simple. If many harmonics are of interest in the input or output mappings, then the choice of pure tones is a poor one. In the case of the switched capacitor filter, a natural transfer function is obtained by choosing a d(t) that samples the output in a narrow interval after it has settled.

2. Model Reduction for LTV Systems

2.1 Obtaining Discrete Rational Functions

Because, for lumped time-varying systems, the time-varying transfer functions are rational functions, it seems reasonable to believe that reduced models can be obtained from the same sorts of rational approximation paths that have been utilized for reduction of LTI systems. Therefore, a representation of the transfer functions in terms of finite dimensional matrices is sought.

To obtain a discrete rational matrix function the operators K and C are discretized. This step is also a model reduction by projection operation, though not usually an orthogonal one, as most codes use some form of collocation (BDF or pseudo-spectral discretizations). In general the model reduction, as will be described in Section 3, may proceed directly from any finite dimensional representation of the operator.

In PTVL systems that occur in RF applications, several explicit assumptions can be introduced about the time variation of the system as an illustration of how the input-output mappings are incorporated into the model reduction procedure. To further simplify the example, the SISO case as the generalization is utilized.

In the example case of a backward Euler discretization:

$$(K+sC)h(s)=b. \tag{10}$$

with $$K = \begin{bmatrix} \frac{C_1}{h_1}+G_1 & & & -\frac{C_M}{h_1} \\ -\frac{C_1}{h_2} & \frac{C_2}{h_2}+G_2 & & \\ & \ddots & \ddots & \\ & & -\frac{C_{M-1}}{h_M} & \frac{C_M}{h_M}+G_M \end{bmatrix} \tag{11}$$

$$C = \begin{bmatrix} C_1 & & & \\ & C_2 & & \\ & & \ddots & \\ & & & C_M \end{bmatrix} \tag{12}$$

$$h(s)=[h_1(s)h_2(s) \ldots h_M]^T \tag{13}$$

and $$b=[b_1 b_2 \ldots b_M]^T \tag{14}$$

where $G_j=G(t_j)$, $C_j=C(t_j)$, $b_j=b(t_j)$, $h_j(s)=h(s, t_j)$. In principal, at this point, any of the algorithms developed for reduction of lumped LTI systems can be applied to the matrices and vectors defined in Equations 11–14, if the results are properly interpreted. Note that since the input functions or basis vectors $v_k$ represent time-waveforms, the reduced input and output functions b and d will represent time-varying input and output mappings.

2.2 Preserving System Structure

Recently there has been considerable interest in developing model reduction methods for passive LTI systems that preserve the system passivity. Unlike in the lumped RLC case, the time-varying models considered herein are not necessarily passive, or even stable, since they are obtained from a linearization of a nonlinear system. Indeed, small-signal gain may be a desired property of the model. However, even if no a-priori conditions can be established for the passivity or lack thereof in the time-varying systems, it is presently preferred that at least whatever structural properties that improve computational efficiency, in particular stability or passivity, happen to be possessed by the underlying system, are not destroyed in the model reduction procedure. When an orthogonal projection is performed using orthonormal matrices as described in Section 3, it can be shown using arguments based on the field of values of an operator that properties such as passivity are inherited in the reduced model.

3. Approximating the Krylov Space

The transfer functions from a small-signal sinusoidal input to sinusoids at harmonics of the output can be obtained by the solving the finite difference equations $$\begin{bmatrix} \frac{C_1}{h_1}+G_1 & & & -\frac{C_M}{h_1}\cdot\alpha(s) \\ -\frac{C_1}{h_2} & \frac{C_2}{h_2}+G_2 & & \\ & \ddots & \ddots & \\ & & -\frac{C_{M-1}}{h_M} & \frac{C_M}{h_M}+G_M \end{bmatrix} \begin{bmatrix} \tilde{v}(t_1) \\ \tilde{v}(t_2) \\ \vdots \\ \tilde{v}(t_M) \end{bmatrix} = \begin{bmatrix} \tilde{b}(t_1) \\ \tilde{b}(t_2) \\ \vdots \\ \tilde{b}(t_M) \end{bmatrix} \tag{15}$$

where $\alpha(s) \equiv e^{-sT}$ and T is the fundamental period. The transfer function h(s, t) is then given by $h(s, t)=e^{-st}\tilde{v}(t)$.

It is now convenient to decompose K into a lower triangular and an upper triangular piece, K=L+R. Using the expressions for L and R, Equation (15) then becomes $$(L+\alpha(s)R)\tilde{v}=\tilde{b}(s) \tag{16}$$

If the small-signal modulation operator is defined as $\Omega(s)$, where $\Omega(s)$ is $$\Omega(s) \equiv \begin{bmatrix} Ie^{st_1} & & & \\ 0 & Ie^{st_2} & & \\ & & \ddots & \ddots \\ & & 0 & Ie^{st_M} \end{bmatrix} \quad (17)$$

then the following identification can be made $$h(s) = \Omega^H(s)\tilde{v}(s) \quad (18)$$

and further that, $$K + sC \cong \Omega(s)[L + \alpha(s)R]\Omega^H(s) \quad (19)$$

The left and right hand sides of Equation 19 differ in the treatment of the small signal. The left-hand side represents a spectral discretization, and the right-hand side represents a finite difference discretization.

To solve Equation 16 for some right-hand side $\tilde{b}$, first consider preconditioning with the matrix L. Because L is lower triangular, with a small block bandwidth, block Gaussian elimination is very efficient at computing the inverse acting on a vector. In this procedure, once the M diagonal blocks have been factored, an operation that must be performed exactly once, then every application of the inverse is an M step procedure, at each step needing a backsolve with the factored diagonal matrices and multiplication by the blocks off the diagonal. There is one off diagonal block in each row for the simple backward Euler discretization. The preconditioned system can be written as $$(I + \alpha(s)L^{-1}R)\tilde{V} = L^{-1}\tilde{b}(s) \quad (20)$$

Suppose that Equation 20 is solved by a Krylov-subspace base iterative method such as GMRES. The Krylov subspaces used in the GMRES are preferred to be different Krylov-subspaces than the ones used for model reduction. This is because the presently preferred Krylov subspace of matrix A is invariant to shifts of the form A→A+βI, the same Krylov subspace may be used to solve Equation 20 at multiple frequency points. This "recycled Krylov subspace" algorithm is made even more efficient by exploiting the special structural properties of $L^{-1}R$, and because the spectrum of $L^{-1}R$ is related to the Floquet multipliers of the LTV system. The recycling of the Krylov space also accelerates solution with different right-hand side vectors. However, the finite-difference formulation is not preferred for direct model reduction.

In contrast, the spectral discretized form that is amenable to model reduction is less convenient to work with (contrast Equation 10 and Equation 16). Even if a lower-tridiagonal preconditioner is used, at each different frequency point the preconditioner must be reconstructed (i.e. the diagonal blocks must be re-factored), and the resulting Krylov subspaces are not preserved with shifts in frequency s.

To resolve this, consider what would happen if the matrix V used for the projection was not a basis for the Krylov subspace of $(K+sC)^{-1}$, but instead a nearby matrix. Because of the way the reduced model is formed, only small errors would be introduced into the final model. As long as the model was not evaluated in the vicinity of a pole, the additional errors introduced into the model would be small.

This suggests that the basis for the projector in the model reduction procedure be obtained by using the finite difference equations. Because the basis will be a very good approximation to the Krylov subspaces of the spectral operator, good reduced models should still be obtained. In addition, because of the recycled Krylov scheme, obtaining projectors from expansions about multiple frequency points is essentially no more expensive than single frequency point expansions. This leads to the proposed model reduction algorithm, Algorithm 1. It may be considered an adaptation of the Arnoldi algorithm where approximate linear solvers have been used instead of exact ones.

The recycled Krylov subspace iterative solvers, and block solvers in general, are more efficient than the non-block solvers only if the sequence of right hand sides have Krylov spaces that are "near" one another. To illustrate why recycling might be very effective for the model reduction problem, consider the simple case where C=I and the expansion point is taken at the origin. Then in the exact case the kth order projector $V_k$ is constructed so that $$V_k \subset K_k(K^{-1}, b) \equiv \{b, K^{-1}b, K^{-2}b, \ldots, K^{-(k-1)}b\}. \quad (21)$$

An algorithm that utilizes this is shown below:

ALGORITHM I

Approximate Multipoint Krylov Subspace Model Reduction

Set k=1.
for i=1, ..., $n_q$ {
  for j=1, ..., m(i) {
    if j=1 then
      w=b
    else
      w=$Cv_{k-1}$
    u=$\Omega^H(s_i)[L+\alpha(s_i)R]^{-1}\Omega(s_i)$w
    for l=1, ..., k-1 {
      u=u-$v_l^T$u
    }
    $v_k$=u/||u||
    k+k1
  }
}
$\hat{K}=V^T KV$
$\hat{C}=V^T CV$
$\hat{D}=V^T D$
$\hat{B}=V^T B$ An alternative to the preconditioned procedure utilized above allows each new vector in the model reduction procedure to be obtained by an inner Krylov iteration with the matrix K. Then, since each new right hand side $u_i$ in the model reduction procedure is drawn from a Krylov space of (K, p, m) for some m, the next term in the space of $K_t(K^{-1}, b)$ would be related to the $K_m(K, b)$ and some efficiency could be obtained thereby. In fact, the vector $K^{-q}b$ can be constructed from nearly the same Krylov sequence {b, Kb, ... $K^m b$}, m>q, that is used to construct $K^{-1}b$. Thus it is reasonable to expect that the entire $V_k$ can be constructed from the space {b, Kb, ... $K^m b$}, where m only slightly exceeds k.

For the presently preferred model reduction implementation, a recycled version of the GMRES algorithm is used as a "black box" to solve the equations $L+\alpha(s_i)v_i=p_i$. As a result the properties of the Krylov spaces are automatically exploited without having to perform preconditioning, shifting, etc.

Figure 2:
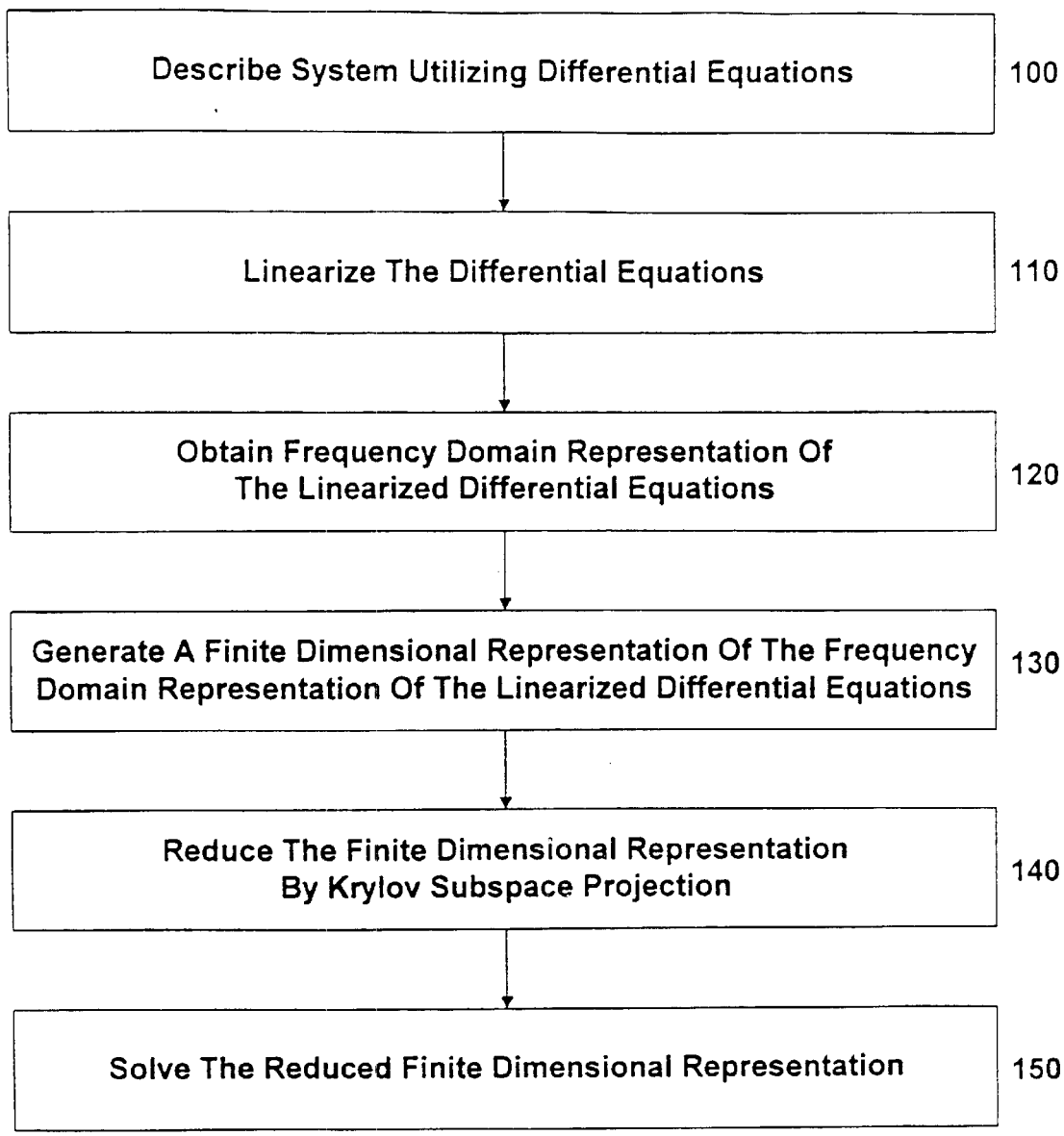
FIG. 2 is a flow chart of a method of time-varying system model reduction according to a presently preferred embodiment of the present invention.

Referring to FIG. 2, a generalized TLV model reduction procedure is described. First, the time varying elements of the circuit or system is described utilizing differential equations, e.g. of the form in Equation 2, step 110. The differential equations are then linearized about a large signal component of the differential equations, step 110. A frequency domain representation of the linearized differential equations is then determined by applying a transfer function, step 120. A finite dimensional representation of the frequency domain representation of the linearized differential equations is then determined, step 130. The finite dimensional representation is preferably obtained by discretizing the operators of matrices representing the operators of the differential equations. The matrices representing the finite dimensional representation are then reduced by a Krylov subspace projection, step 140. It is presently preferred that the basis for the Krylov subspace utilized for projection is not the basis for the matrices representing the finite dimensional representation but the basis of a nearby matrix that is a preconditioned version of the matrices. The approximated matrices are then solved to obtain the reduced model, step 150.

4. Examples of Model Reductions of Time Varying Linear Systems

To test the model reduction procedure, the proposed algorithms were implemented in a time domain RF circuit simulator. The large signal periodic steady state is calculated using a shooting method. The time-varying linear system was discretized using variable timestep second order backward difference formulas.

The first example considered was the switched capacitor filter previously discussed, running at a clock frequency of 25 kHz. This example generated 58 equations in the circuit simulator, and 453 timesteps were needed to describe the steady state waveform. The same timesteps generated in the solution of the periodic steady state problem were used to discretize the time-varying linear operator. For the model reduction procedure, the input function b(t) (see Equation 10) was constant, corresponding to the continuous sinusoidal input present at the filter input. To specify an output function, a sample function that was constant over a 200 ns period 1 $\mu$s before the clock edge at the start of the cycle was utilized. Essentially, the final model is a real LTI system that represents a transfer function between the continuous analog input and the sampled digital output. The amplitude of the transfer function, as a function of input frequency, of the reduced model is shown in FIG. 3.

Figure 3:
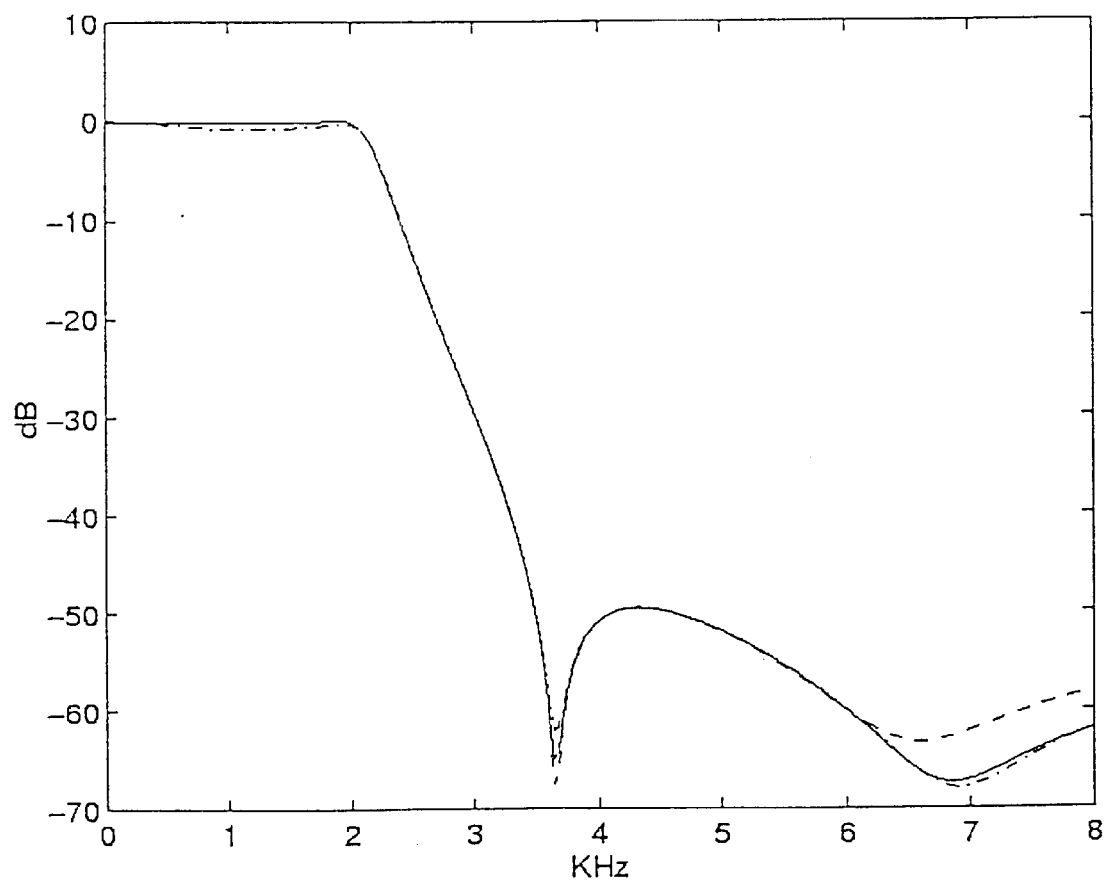
FIG. 3 shows an amplitude of transfer function of a time-sampled switched-capacitor according a presently preferred embodiment of the present invention.

Two nine-state models are shown in FIG. 3. The model shown with a dashed line was generated by matching nine real moments at the origin. The dash-dot line, virtually identical to the actual transfer function, was generated from matching three real moments at the origin, and one moment at 200 kHz, 400 kHz, and 800 kHz on the imaginary axis. As these expansion points were off the real axis, each complex moment in the Krylov space generates two states in the final real model, corresponding to the Krylov vector and its complex conjugate. The multi-point approximation is seen to be a better match.

The second example is the complex image rejection receiver. This receiver is a complicated circuit with several functional component blocks (a low noise amplifier, a splitting network, two double balanced mixers, and two broadband Hilbert transform output filters). The entire circuit has 167 bipolar transistors and generates 986 equations in the circuit simulator. Two hundred timesteps were needed for the time domain analysis, so that the matrix K has a rank of almost 200,000.

Figure 4:
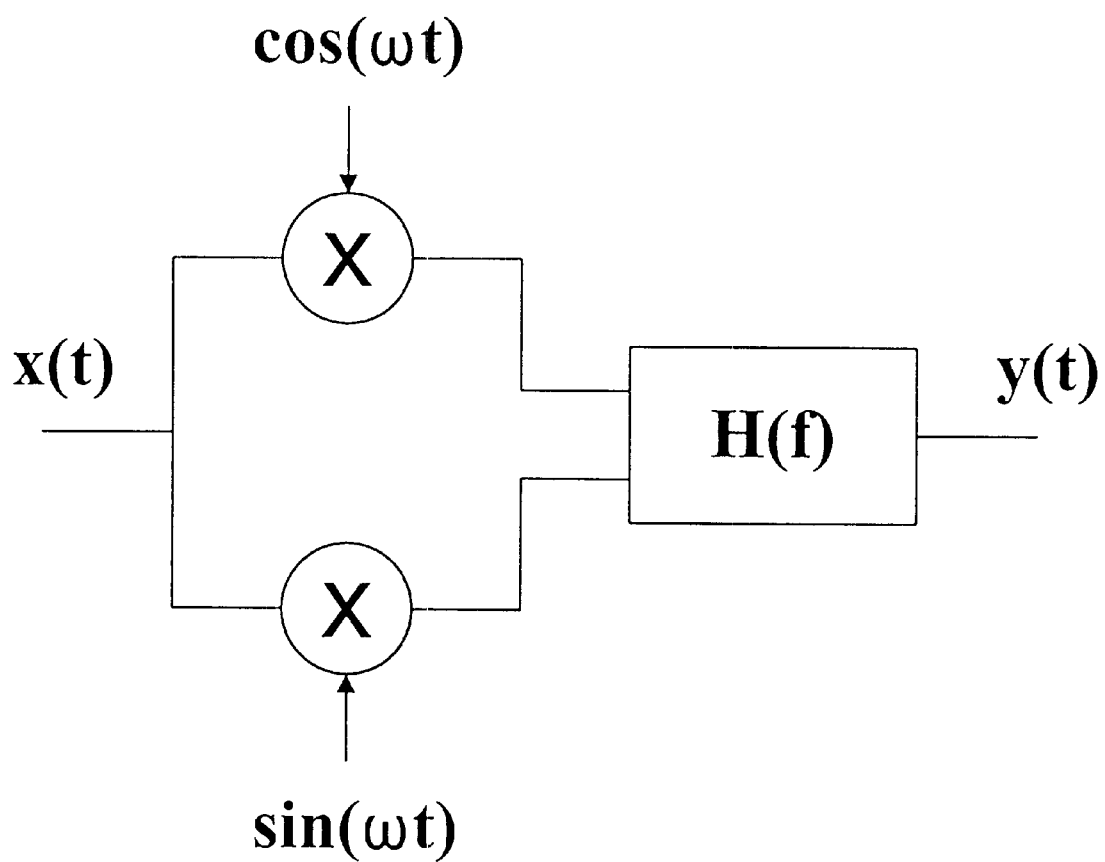
FIG. 4 depicts a macro-model of a receiver obtained utilizing a procedure according to a presently preferred embodiment of the present invention.
Figure 5:
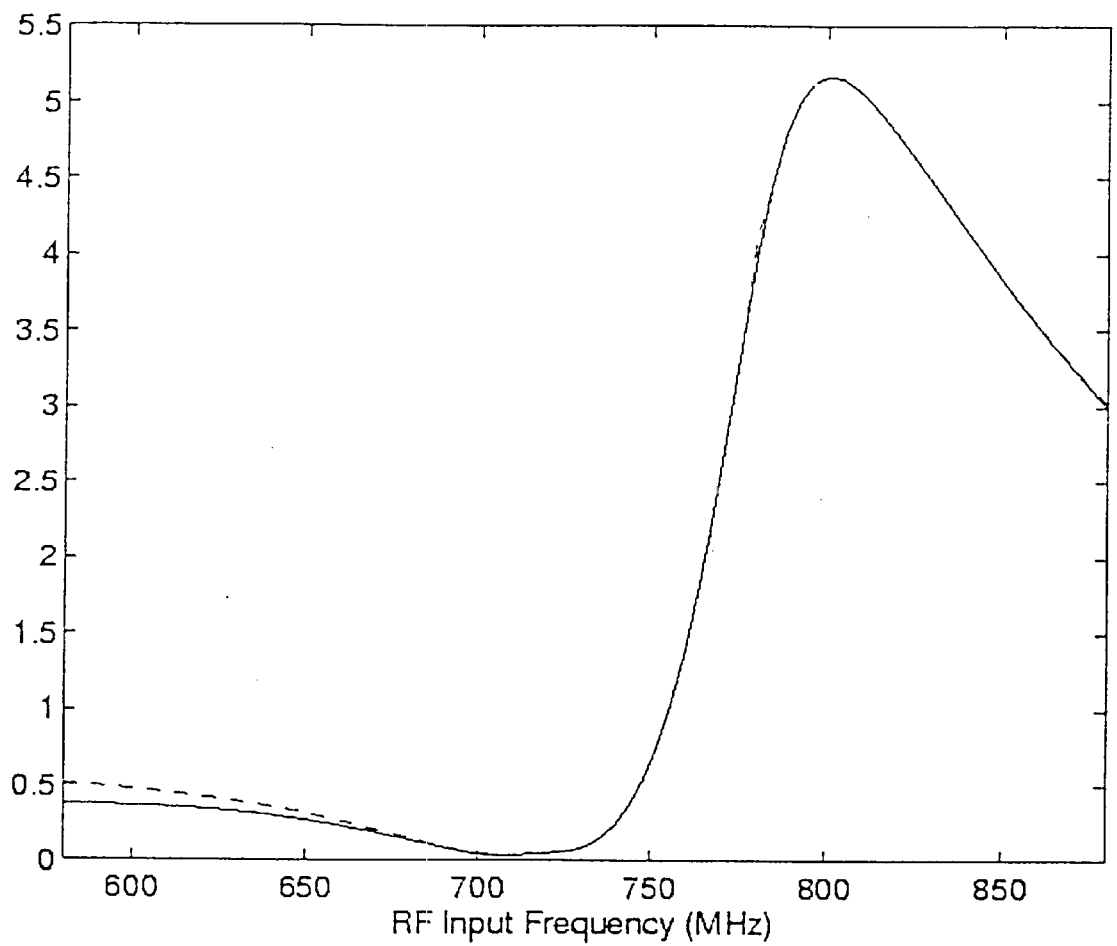
FIG. 5 depicts a transfer function response of a mixer modeled as having a time varying linear response according a presently preferred embodiment of the present invention.

A fifteenth order real valued time-varying model was generated to represent the receiver conversion path from RF to output. Since a model from multiple sidebands to mixer output was desired, the adjoint matrix $K^T$ was used to generate the model reduction. In this case the time-varying elements appear before a LTI filter in the final model, as is shown schematically in FIG. 4. Basing the model reduction on K is more convenient if the time-varying elements are placed after the LTI component. The mixing elements shift the input from the RF frequency by 780 MHz, the mixer LO frequency. Following these elements is a multi-input LTI filter whose response is shown in FIG. 5. The lower sideband rejection characteristic of this mixer is evident in the model. If the model were used in a suppressed carrier DSP simulator, the mixing elements would simply be omitted.

Table 1 shows the statistics for the computational costs for the reduced model extraction and evaluation. It should be noted that two hundred frequency points were considered in the filter example and fifty in the mixer example. In both examples the reduced model took less time to extract than the single frequency sweep, and the evaluation was vastly more efficient (in fact the overhead in the code was sufficient that it was difficult to determine exactly how much time was consumed in the actual model evaluation). Note the efficiency in particular of the reduction of the switched capacitor example. The time-varying model has a rank of 26,274, yet the reduced model was generated in only 7 CPU seconds.

The efficiency of the recycled Krylov algorithm is evident. In the case of the filter, for an order-nine real model, only 18 applications of $L^{-1}$ were required in the recycled GMRES procedure that obtained the moments. The remaining matrix vector products (or backsolves) were needed to perform the projection or for the initial preconditioning steps. Even in the mixer example, where GMRES had much more difficulty converging, 124 backsolves needed for the reduction, about 8 per model order, which is still good.

| Circuit | | MOR/Recycle | MOR/Std | Pointwise |
|---|---|---|---|---|
| SCF | MVP | 45 | 99 | 410 |
| | Reduce | 7 s | 12 s | — |
| | Solve | 1 s | S | 1.5 m |
| Receiver | MVP | 166 | 1980 | 280 |
| | Reduce | 4 m | 48 m | — |
| | Solve | 2 s | 2 s | 8.5 m |

Table 1 provides a comparison of time-varying model reduction procedures and pointwise frequency sweeps. The frequency sweeps were accelerated by the recycled GMRES algorithm. MVP refers to equivalent real-real matrix vector solves with the matrix L. "Reduce" is the model reduction time in seconds or minutes, and "solve" the CPU time required to obtain the frequency response.

A method and system for extraction of simple and compact macromodels from nonlinear, time-varying transistor level circuit descriptions was described in Sections 1–3 above. As the switched capacitor and receiver examples demonstrate, these models are capable of representing very complicated underlying dynamics. The class of systems that can be represented as linear time-varying is very broad and so the approach proposed here is potentially a powerful analysis and abstraction tool. The use of the multi-point Krylov subspace based rational approximation with the inner approximate recycle GMRES solver appears to be a particularly synergistic combination and is primarily responsible for the efficiency of the method.

In fact, an advantage of the multi-point approximations is that they seem to be more robust in their ability to use approximant solves of very low accuracy, when coupled with the recycled GMRES solver. When the requested solution tolerance from the recycled GMRES solver is set very loosely, it will fairly quickly cease to generate new vectors for use in the model reduction projection space. Moving to another frequency expansion point introduces new information into the recycled solver, and new directions are generated for the model reduction projection.

There are several immediate extensions of the LTV model reduction method and system described herein. The formalism and algorithms can be trivially extended to the case of quasi-periodic small-signal analysis. Similarly the methodology described herein can be directly applied to obtain reduced models of (poly)cyclostationary noise transfer functions.

Reference, will now be made to a method for generating reduced order models for non-linear system according to a preferred embodiment of the present invention.

5. Nonlinear Systems

Now consider a system with a nonlinear state-evolution function $$\frac{dx}{dt} = f(x) + Bu, \; y = Cx \quad (22)$$

where now a nonlinear f: $R^n \rightarrow R^n$ is described. The formal projection scheme may be applied to this system of equations to obtained a "reduced" model $$\hat{E}\frac{dz}{dt} = V^T f(Vz) + \hat{B}u; \; \hat{y} = \hat{C}\hat{x} \quad (23)$$

where $EA \in R^{n \times n}$; $x(t) \in R^n$ is the internal state, $B \in R^{n \times q}$, $u(t) \in R^p$ is the input, $y(t) \in R^q$ is the output, N is the system order, and p and q are the number of system inputs and outputs respectively.

The first problem with this approach is that it is not obvious how to choose the space V. Approaches based on analysis of the linearized model do not include information about nonlinear model properties and therefore cannot be directly utilized. Heuristic approaches based on the singular value decomposition of a statistically representative sampling of the state-space x(t) may be used, but the heuristic computations are extensive and little control over model accuracy is available. Balancing based procedures exist in theory, but it is not clear how they may be computed.

More importantly, it is not generally possible to extract a reduced macromodel from the term $V^T f(Vz)$. It is always possible to evaluate $V^T f(Vz)$ by explicitly constructing $\hat{x}=Vz$, evaluating the nonlinearity and finally explicitly projecting onto the reduced space by multiplication with $V^T$. However, except in special situations (e.g. large linear subnetworks), if there are N degrees of freedom in the detailed circuit description, then evaluation of the full model will require O(N) operations, and because f is a nonlinear function and therefore V may not be generally passed through the parentheses, evaluation of the reduced model will also require O(N) operations. For a reduced model, it is preferred that "O(q)" operations (q being the order of the model) are needed to obtain the model. That is, a model evaluation cost that is related only to the complexity of the system input-output relationship, not to the size of the underlying system. For example, if an LTI system transfer function can be approximated by a fourth-order rational function, the PVL algorithm can generally obtain a reduced model with number of states not greatly exceeding four, regardless of the size of the underlying detailed description.

Thus to obtain reduced descriptions of nonlinear systems, it is generally necessary to reduce the complexity of the nonlinear function. This can be accomplished by approximating the nonlinear function f(x) with functions of simpler form.

6. Reduction of Nonlinear Systems

6.1 Polynomial Approximations

Consider again the system of Equation (22), which is sufficiently general to illustrate all the essential aspects of the analysis (circuit equations may be always be written as Edx/dt=f(x)+Bu with possibly singular E, and the extension to this case is straightforward). In many cases f(x) may be expanded in a series of multidimensional polynomials (such as, but not necessarily, a multidimensional Taylor series), $$f(x) = \sum_{k=1}^{\infty} \phi_k(x, \ldots, x) \quad (24)$$

where each $\phi_k$ is a k-multilinear form. That is, $\phi_1(x)$ is linear in the argument x, and may be written as a matrix $\phi_1(x) = A_1 x$, $\phi^2(x, x)$ represents the quadratic terms, and so forth. Reduced models can then be formed by using a projection formalism to construct reduced $\hat{\phi}$ such that $$\hat{\phi}(z, \ldots, z) = V^T \phi(Vz, \ldots, Vz). \quad (25)$$

A concrete representation of the k may be obtained by using Kronecker forms. In particular, defining $$x^{(1)} \equiv x \quad (26)$$

$$x^{(2)} \equiv x \otimes x \quad (27)$$

$$x^{(2)} \equiv x \otimes x \otimes x \quad (28)$$

and so forth, then the expansion for f(x) is $$f(x) = A_1 x^{(1)} + A_2 x^{(2)} + A_3 x^{(3)} + \ldots \quad (29)$$

so that $$\frac{dx}{dt} = A_1 x^{(1)} + A_2 x^{(2)} + A_3 x^{(3)} + \cdots + Bu \quad (30)$$

where $A_k \in R^{n \times n^k}$. The matrices $A_k$ represent the k-dimensional tensors needed to expand f(x) in multidimensional series. These tensors are usually extremely sparse and in that case a product of one of the $A_k$ and a vector $x^{(k)}$ can be computed in O(N) operations if N is the dimension of the vector $x^{(1)}$.

With this realization of the multilinear forms, the reduced multilinear forms $\hat{\phi}(z, \ldots, z)$ can be expressed as the matrices $$\hat{A}_k = V^T A_k (V \otimes V \otimes \ldots V) \quad (31)$$

Because of the Kronecker product identity, Equation 31 can be rewritten as $$A_k(Vz \otimes Vz \otimes \ldots Vz) = A_k(V \otimes V \otimes \ldots V)(z \otimes Vz \otimes \ldots z). \quad (32)$$

6.2 Variational Analysis

To see how the above described model reduction procedures may be easily applied to nonlinear systems described with polynomial expansions, a variational procedure commonly used for computing Volterra kernels is adopted. Suppose that α is introduced as a variational parameter and the response of the system $\dot{x}=f(x)+B(\alpha u)$ is calculated as a function of α. The response can then be expanded in a power series in α, $$x(t)=\alpha x_1(t)+\alpha^2 x_2(t)+\ldots \quad (33)$$

It is clear that $$x^{(2)}(t)=\alpha^2 x_1^{(2)}+\alpha^3[x_1 \otimes x_2 + \otimes x_1]+\ldots \quad (34)$$

$$x^{(3)}(t)=\alpha^3 x_1^{(3)}+\ldots \quad (35)$$

and so $$\alpha x_1(t)+\alpha^2 x_2(t)+\ldots = \alpha A_1 x_1 + \alpha^2[A_1 x_2 + A_2(x_1 \otimes x_1)]+\ldots \quad (36)$$

By comparing terms in the variational parameter α, a set of differential equations can be obtained, each N-dimensional, that describe the time-evolution of each of the $X_k$, $$\dot{x}_1 = A_1 x_1 + Bu \quad (37)$$

$$\dot{x}_2 = A_1 x_2 + A_2(x_1 \otimes x_1) \quad (38)$$

$$\dot{x}_3 = A_1 x_3 + A_2[x_1 \otimes x_2 + x_2 \otimes x_1] + A_3[x_1 \otimes x_1 \otimes x_1] \quad (39)$$

etc.

6.3 Model Reduction

Reviewing Equations 37–39, it can be seen that the system describing the first order response is a standard linear state-space system. To obtain a model of this system, a Krylov subspace with starting vectors given by the column space of B can be computed. The system describing the second order response is also a linear state-space system with the same system matrix $A_1$; it only has different inputs. To obtain a reduced model that will match the frequency response of the second order component of the response, the Krylov space of the inputs to the second order system must be spanned. The input to the second order system is $A_2$ times the "squared" first order response. Now the key point is that if the first order system was adequately described by a reduced model obtained from a projector matrix $V_1$, then the inputs to the second order system must lie in the column space of $A_1(V_1 \otimes V_1)$. Thus to obtain a space $V_2$ that will give a model for the second order response, $\tilde{V}_1$, whose columns are a basis for $K_q((s_0 E-A)^{-1}E,(s_0 E-A)^{-1}B)$, is computed. Then $V_2$, whose columns span $K_q((s_0 E-A)^{-1}E, (s_0 E-A)^{-1}A_2(V_1 \otimes V_1))$ can be computed. The procedure for higher orders of the nonlinear expansion follows analogously.

This observation also gives some insight into when reduced models based on strictly linear information are useful. If a space V, perhaps generated from the Krylov $K(A_1^{-1}, B)$, has small projection onto the range of one of the multilinear forms $A_k(V_j \otimes V_j \ldots \otimes V_j)$, then the resulting reduced model will not likely be a good approximation to the kth order response. The only way to guarantee an accurate nonlinear representation is to include information about the higher-order nonlinear terms explicitly in the reduction process as suggested above. Conversely, if the span of $A_k(V_j \otimes V_j \ldots \otimes V_j)$ is already contained in the span of V, then it is advantageous to "deflate" the spaces $V_k$ obtained at higher order by performing a singular value decomposition of $[V_1 V_2 \ldots]$ and using the resulting single V to perform the projection. Deflation is particularly important to obtain a reasonable size model when matching the frequency domain response of the higher-order non-linearities, since, strictly speaking, the number of required terms grows exponentially with order of the polynomial expansion (just as the number of degrees of freedom of Volterra kernels does).

Finally, it is worth noting that the above analysis applies for a general operating point. In particular, by adopting the procedures described with respect to obtaining reduced order models of time varying systems, a time-varying weakly nonlinear model reduction procedure can be derived. Essentially the approach matches "moments" of time-varying Volterra kernels. The models can thus be used to predict intermodulation distortion and other nonlinear effects in RF circuits operating under periodic or quasiperiodic bias.

Figure 6:
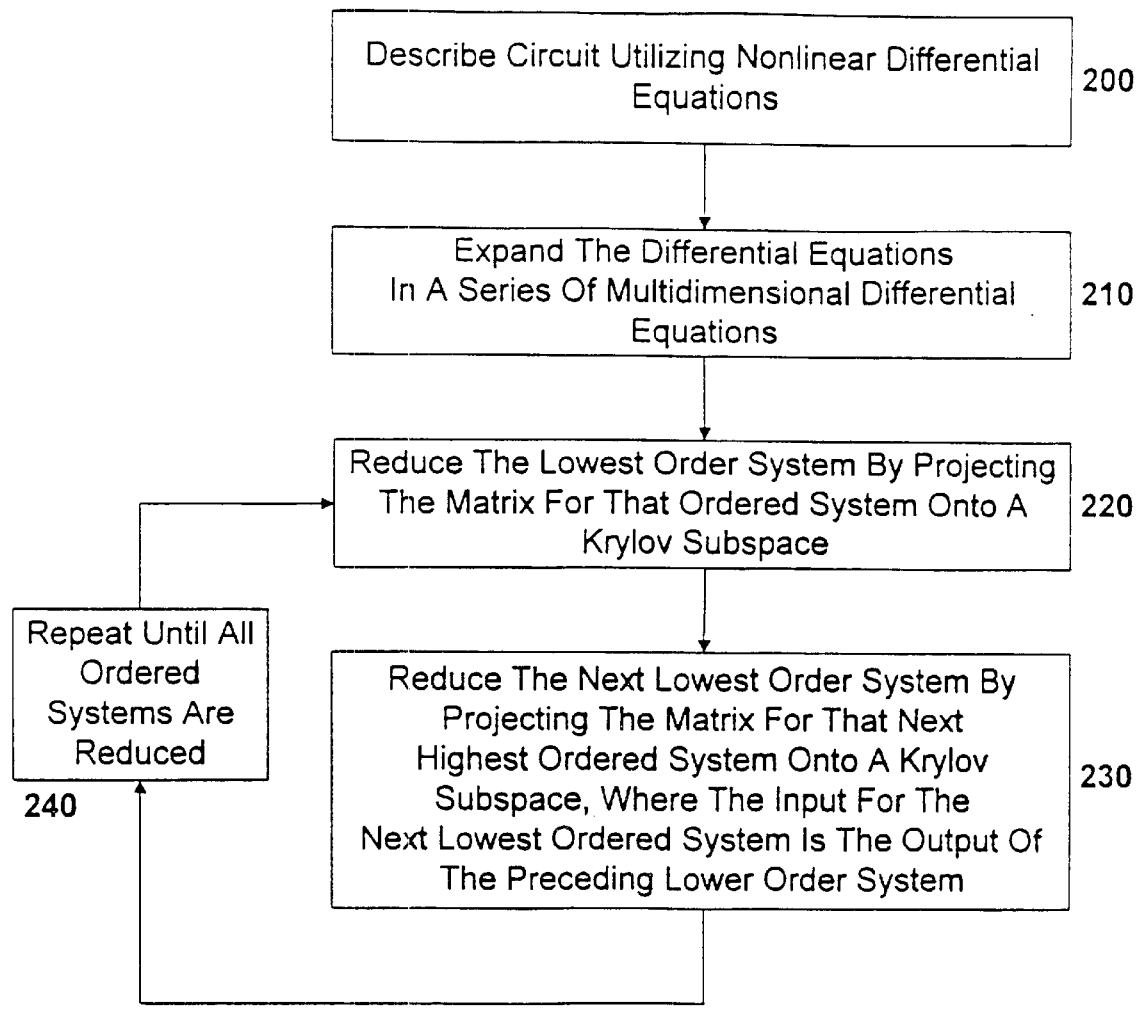
FIG. 6 is a flow chart of a presently non-linear system model reduction method according to a presently preferred embodiment of the present invention.

Referring to FIG. 6, a non-linear system or circuit is described utilizing non-linear differential equations, step 200. The differential equations are then expanded into a series of multidimensional differential equations each representing a separate harmonic response of the non-linear system or circuit, step 210. A model is then generated for the lowest order differential equation, by a Krylov subspace projection method, step 220. The reduced order model generated at step 220, is then utilized as the input for the model reduction of the next lowest ordered model, by a krylov subspace projection method, step 230. This process is then sequentially repeated for each ordered set of differential equations, step 240.

7. Examples of Model Reductions of Non-Linear Systems

Figure 7:
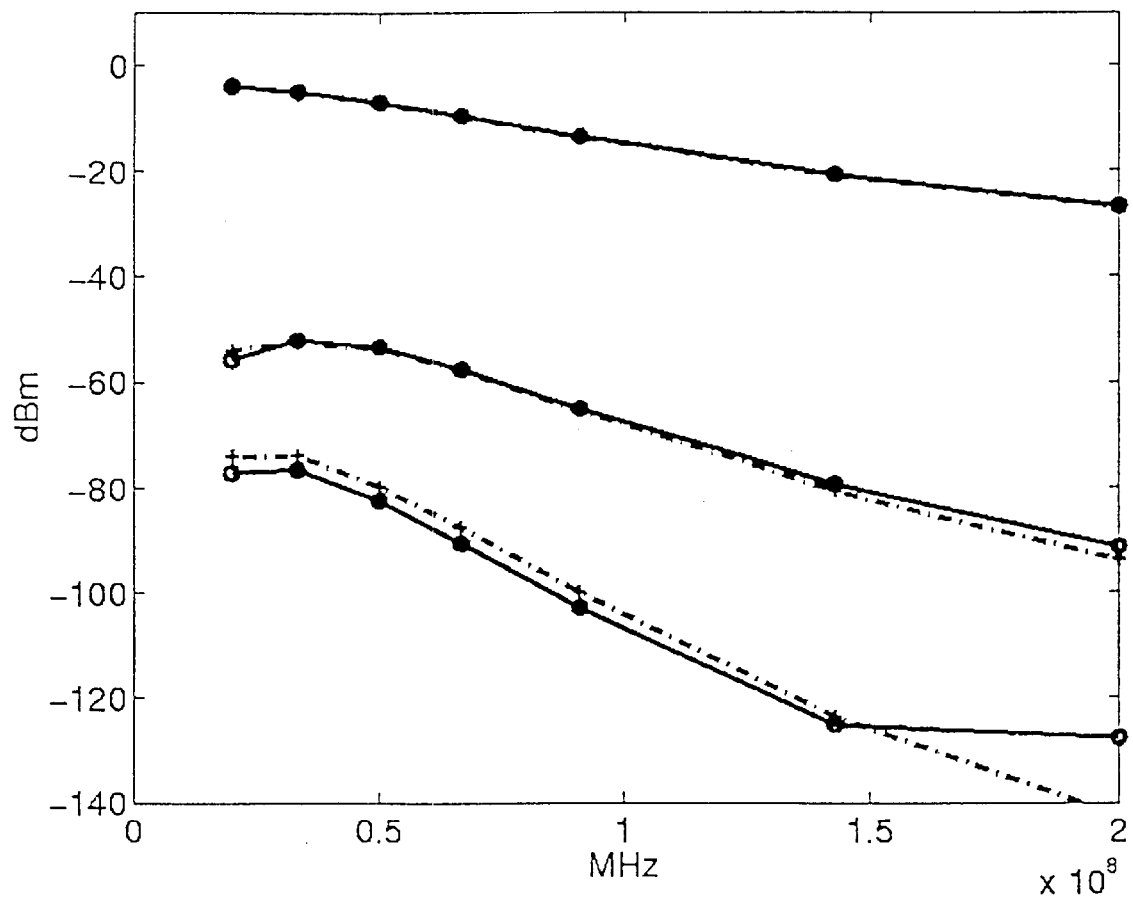
FIG. 7 is the actual and modeled response, utilizing a presently preferred method of non-linear system model reduction, of an RF mixer according to the present invention.

As an example a demonstration of the model reduction of an RF mixer is utilized in FIG. 7. First, second, and third order response of RF mixer as a function of signal input frequency. The full system response is shown as the solid (o) curves and the reduced model as the dashed (+) curves. The primary upconversion response as well as the first two terms generated by distortion (second and third order responses in the formulation above) is computed. Note that by measuring the distortion (an intrinsically nonlinear phenomenon) in the frequency domain the contributions of the linear and non-linear components can be separated to provide the circuit response. FIG. 7 shows comparisons of the original system and an dimension-38 reduced model needed to match the frequency response of the first and second order non-linearities, respectively, up to fourth and second order, respectively, in the frequency domain series expansion. Harmonic balance was used to calculate the response of the original and reduced system. The generation of the reduced model required about four times as much computation time as generation of the initial operating point and less computation time than a linear time-varying (i.e. first-order small-signal) analysis performed on the detailed circuit at the same set of frequency points. Good agreement is observed for the first and second order terms and the third order response is, interestingly, fairly well captured also. Even for this relatively small circuit, compared to detailed simulation approaches such as multi-frequency harmonic balance (or envelope based simulations) needed to capture the distortion induced by the signal tones in the presence of the periodic local oscillator, the model reduction procedure results in more than an order of magnitude reduction in computational complexity.

The above approach to model reduction of nonlinear circuits with time-varying operating points has modest computational requirements, comparable to the cost of computing the operating point itself, and is based on familiar Krylov-subspace based projection procedures.

Figure 8:
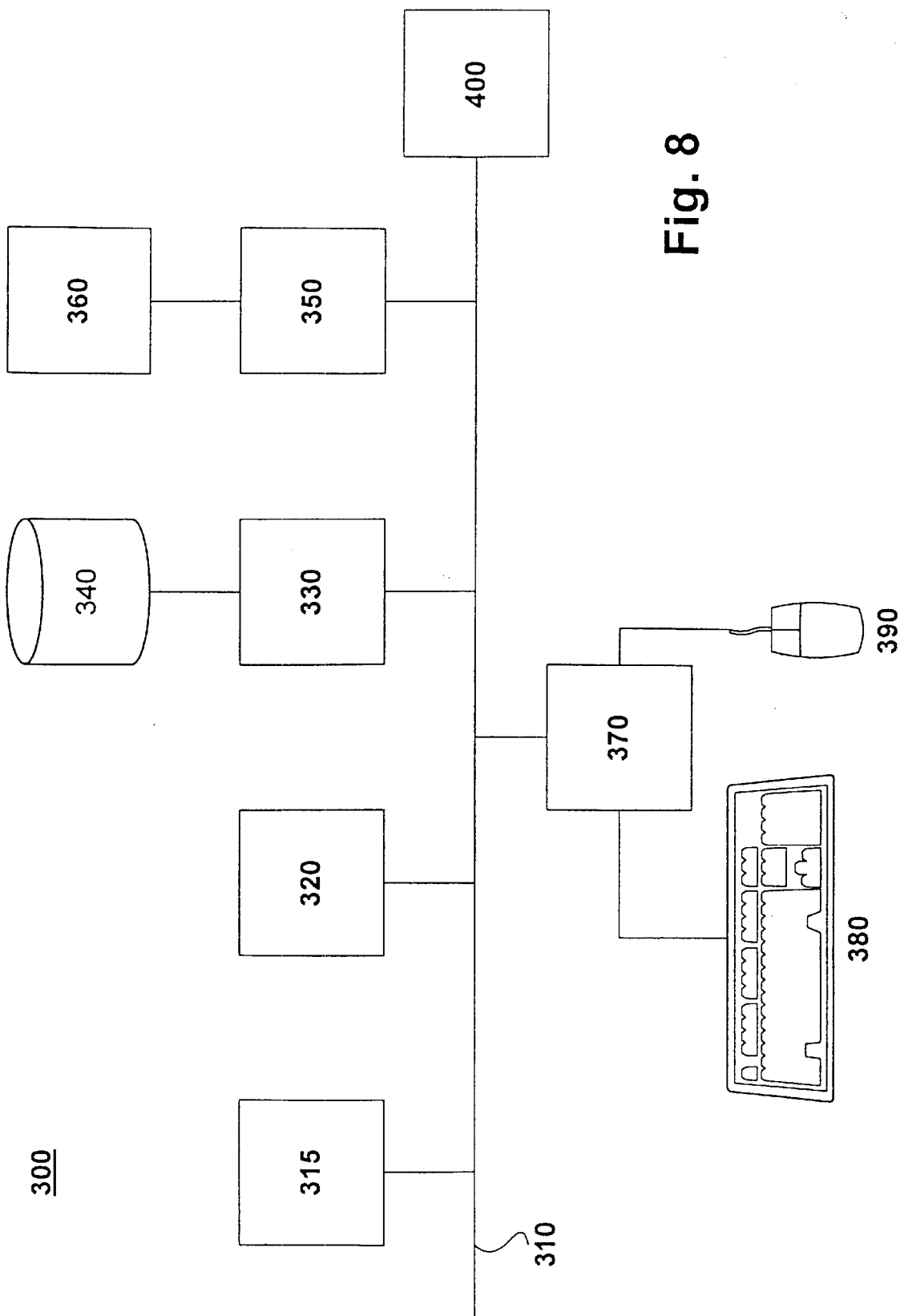
FIG. 8 is a diagram of a presently preferred computing system capable of operating according to the model reduction methods according to a presently preferred embodiment of the present invention.

Referring to FIG. 8, computer system 300 includes system bus 310, processing unit 315, memory device 320, fixed disk interface 330, fixed disk 340, display interface 350, display 360, bus interface 370, inputs 380 and 390, and network communication interface 400.

The memory device 320 stores data and programs. Operating together with fixed disk interface 330, fixed disk 340 also stores data and programs. However, memory device 340 has faster access speed than fixed disk 330, while fixed disk 340 generally has higher capacity than memory device 320.

In the present invention, the instructions for performing the steps shown in FIGS. 5 and 7, and the methods and variations thereof described above can be stored in memory device 320 or hard disk 340. The program can be executed by processing unit 315. In this way, a computing device can be programmed to perform the steps and functions for model reduction that are described in this application.

Figure 9:
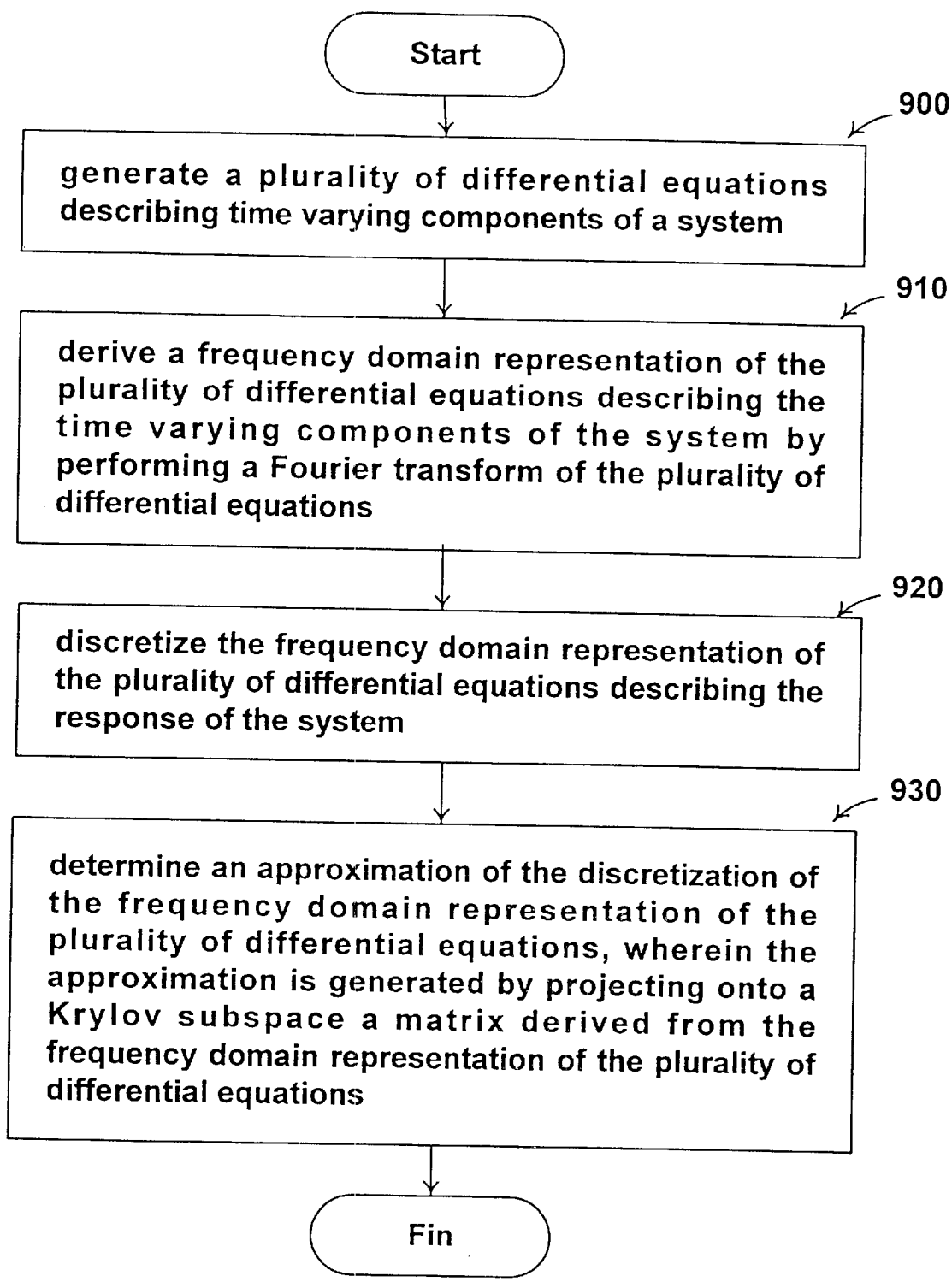
FIG. 9 is a flow chart illustrating a process of a method of generating a reduced order model of a system having time varying components.

FIG. 9 is a flow chart illustrating a process of a method of generating a reduced order model of a system having time varying components. Step 900 generates a plurality of differential equations describing time varying components of a system. Step 910 derives a frequency domain representation of the plurality of differential equations describing the time varying components of the system by performing a Fourier transform of the plurality of differential equations. Step 920 discretizes the frequency domain representation of the plurality of differential equations describing the response of the system. And, step 930 determines an approximation of the discretization of the frequency domain representation of the plurality of differential equations, wherein the approximation is generated by projecting onto a Krylov subspace a matrix derived from the frequency domain representation of the plurality of differential equations.

While the embodiments, applications and advantages of the present inventions have been depicted and described, there are many more embodiments, applications and advantages possible without deviating from the spirit of the inventive concepts described and depicted herein. The invention should only be restricted in accordance with the spirit of the claims appended hereto and is not restricted by the preferred embodiments, specification or drawings.

What is claimed is:

1. A method of generating a reduced order model of a system having time varying components, comprising the steps of:

generating a plurality of differential equations describing time varying components of a system;

deriving a frequency domain representation of the plurality of differential equations describing the time varying components of the system by performing a Fourier transform of the plurality of differential equations;

discretizing the frequency domain representation of the plurality of differential equations describing the response of the system;

determining an approximation of the discretization of the frequency domain representation of the plurality of differential equations, wherein the approximation is generated by projecting onto a Krylov subspace a matrix derived from the frequency domain representation of the plurality of differential equations; and generating at least one response of said system based on said approximation;

wherein the step of generating a plurality of differential equations further comprises determining a polynomial expansion of the plurality of differential equations and determining a plurality of ordered differential equations corresponding to the polynomial expansion of the plurality of differential equations, and the step of deriving a frequency domain representation of the plurality of differential equations comprises determining a plurality of transfer functions representations each corresponding to a plurality of ordered differential equations corresponding to the polynomial expansion of the plurality of differential equations, and the step of determining the approximation comprises sequentially determining a reduced order model for each of the plurality of frequency domain representations, each reduced order model being determined by providing as the input to each order of differential equations the result of the next highest ordered differential equations.

2. The method of claim 1 wherein the matrix comprises a spectral discretization of the time varying equations of the system.

3. The method of claim 1 wherein the step of determining the approximation includes a step of generating a substantially equivalent matrix to the matrix, the approximation being generated by projecting onto a Krylov subspace the substantially equivalent matrix.

4. The method of claim 3 wherein the substantially equivalent matrix comprises a finite dimensional discretization of the frequency domain representation of the plurality of differential equations.

5. The method of claim 3 wherein the step of determining the approximation comprises the steps of:

decomposing the dicretization of the frequency domain representation of the plurality of differential equations into component matrices;

multiplying the component matrices by a modulation operator matrix to obtain a finite difference discretized matrix; and projecting the finite difference discretized matrix to obtain the approximation.

6. The method of claim 1 wherein the step of discretizing the frequency domain representation of the plurality of differential equation comprises creating a finite difference discretization of the frequency domain representation of the plurality of differential equations; and the step of generating the approximation comprises determining the approximation by projecting a matrix representing the finite difference discretization of the frequency domain representation onto a Krylov subspace.

7. The method of claim 1 wherein the step of determining the approximation representation by projecting onto a Krylov subspace the matrix derived from the frequency domain representation of the plurality of differential equations comprises the step of utilizing a recycled GMRES solver to determine the projection of the matrix onto the Krylov subspace.

8. The method of claim 1, wherein said step of generating at least one response comprises the steps of determining a response of the approximation at a first frequency and determining a response of the approximation at a second frequency.

9. The method of claim 1 wherein:

the plurality of differential equations comprise a large signal component and a small signal component;

method further comprising a step of linearizing the small signal component about the large signal component;

the step of generating a frequency domain representation of the plurality of differential equations comprises the step of deriving a frequency domain representation of the linearized small signal component; and the step of determining an approximation of the discretization of the frequency domain representation comprises determining the approximation of the frequency domain representation of the linearized small signal component.

10. The method of claim 1 wherein the system is modeled as having a non-linear response.

11. A method for generating a reduced order model of a system having a time varying components, comprising:

generating a plurality of differential equations describing a system having a time varying output, the plurality of differential equations comprising a large signal component and a small signal component;

linearizing the small signal component of the differential equations about the large signal component to obtain linearized small signal differential equations;

determining the frequency domain representations of the small response equations by fourier transforming the linearized small signal differential equations; and determining an approximation of the frequency domain representations of the linearized small signal differential equation by determining the approximation of a time-varying matrix corresponding to the frequency response of the electronic circuit as determined by the frequency domain representations of the linearized small signal differential equations, and generating a substantially equivalent matrix by performing a Krylov subspace projection of the time-varying matrix;

wherein:

the substantially equivalent matrix comprises a finite dimensional discretization of the frequency domain representation of the plurality of differential equations; and the step of determining the approximation includes the steps of, decomposing the dicretization of the frequency domain representation of the plurality of differential equations into component matrices, multiplying the component matrices by a modulation operator matrix, and projecting the result of the multiplication of the component matrices by the modulation operator matrix to obtain the approximation.

12. The method of claim 11 wherein the time-varying matrix corresponds to an approximation time-varying matrix corresponding to the frequency response of the system as determined by the frequency domain representations of the linearized small signal differential equations and the step of determining the approximation comprises generating a Krylov subspace projection of the of the approximation of the time-varying matrix.

13. A method for generating a reduced order model of a system having a time varying components, comprising the steps of:

generating a plurality of differential equations comprising a large signal component and a small signal component;

linearizing the small signal component of the differential equations about the large signal component to obtain linearized small signal differential equations;

determining the frequency domain representations of the small response equations by fourier transforming the linearized small signal differential equations;

discretizing the frequency domain representation by creating a finite difference discretization of the frequency domain representation;

determining an approximation of the frequency domain representations of the linearized small signal differential equation by determining the approximation of a time-varying matrix corresponding to the frequency response of the electronic circuit as determined by the frequency domain representations of the linearized small signal differential equations, and generating a substantially equivalent matrix by performing a Krylov subspace projection of the time-varying matrix; and generating a reduced order model of the electronic circuit based on said approximation;

wherein the step of determining an approximation comprises projecting a matrix representing the finite difference discretization of the frequency domain representation onto a Krylov subspace.

14. The method of claim 11 wherein the step of determining the approximation representation by projecting onto a Krylov subspace the matrix derived from the frequency domain representation comprises the step of utilizing a recycled GMRES solver to determine the projection of the matrix onto the Krylov subspace.

15. A method for generating a reduced order model of a system having a non-linear components, comprising:

receiving an circuit description corresponding to a component level net list of a circuit having a non-linear response;

deriving non-linear steady state differential equations corresponding to the response of the circuit having a non-linear response;

deriving a transfer function representation of the non-linear steady state differential equations;

generating a polynomial expansion of the transfer function representation, the polynomial expansion comprising a plurality of ordered differential equations;

determining an approximation of the polynomial expansion by determining a reduced order model for each of the plurality of ordered differential equations by generating a substantially equivalent matrix to a matrix derived from the frequency domain representation, the approximation being generated by projecting onto a Krylov subspace the substantially equivalent matrix;

generating a reduced order model of the circuit description based on the approximation, wherein a reduced order model for each ordered differential equation of the plurality of ordered differential equation is a reduced order model obtained from a next lower ordered differential equation and the finite dimensional representation comprises the reduced order model of the lowest order differential equation calculated;

wherein the step of determining the approximation includes the steps of, decomposing the discretization of the frequency domain representation of the plurality of differential equations into component matrices, multiplying the component matrices by a modulation operator matrix, and projecting the result of the multiplication of the component matrices by a modulation operator matrix to obtain the approximation.

16. The method of claim 15 wherein the substantially equivalent matrix comprises a finite dimensional discretization of the frequency domain representation of the plurality of differential equations.

17. A method for generating a reduced order model of a system having a non-linear components, comprising:

receiving an circuit description corresponding to a component level net list of a circuit having a non-linear response;

deriving non-linear steady state differential equations corresponding to the response of the circuit having a non-linear response;

deriving a transfer function representation of the non-linear steady state differential equations;

generating a polynomial expansion of the transfer function representation, the polynomial expansion comprising a plurality of ordered differential equations; and determining an approximation of the polynomial expansion by determining a reduced order model for each of the plurality of ordered differential equations generating a reduced order model of the circuit description based on the approximation, wherein a reduced order model for each ordered differential equation of the plurality of ordered differential equation is a reduced order model obtained from a next lower ordered differential equation and the finite dimensional representation comprises the reduced order model of the lowest order differential equation calculated;

wherein the step of discretizing the frequency domain representation of the plurality of differential equation comprises creating a backward-Euler discretization of the frequency domain representation of the plurality of differential equations; and the step of generating the approximation comprises determining the approximation by projecting a matrix representing the backward-Euler discretization of the frequency domain representation onto a Krylov subspace.

18. The method of claim 17 further comprising the steps of determining a response of the approximation at a first frequency and determining a response of the approximation at a second frequency.

19. A device for generating a reduced order model of a system having time varying components, comprising:

means for generating a plurality of differential equations describing time varying components of a system;

means for deriving a frequency domain representation of the plurality of differential equations describing the time varying components of the system by performing a Fourier transform of the plurality of differential equations;

means for discretizing the frequency domain representation of the plurality of differential equations describing the response of the system;

means for determining an approximation of the dicretization of the frequency domain representation of the plurality of differential equations, wherein the approximation is generated by projecting onto a Krylov subspace a matrix derived from the frequency domain representation of the plurality of differential equations;

means for generating a reduced order model of said system based on said approximation;

wherein:
said means for generating a plurality of differential equations includes means for determining a polynomial expansion of the plurality of differential equations and means for determining a plurality of ordered differential equations corresponding to the polynomial expansion of the plurality of differential equations; and said means for determining a frequency domain representation of the plurality of differential equations comprises means for determining a plurality of transfer functions representations each corresponding to a plurality of ordered differential equations corresponding to a polynomial expansion of the plurality of differential equations, and said means for determining the approximation comprises means for sequentially determining a reduced order model for each of the plurality of frequency domain representations, each reduced order model being determined by providing as the input to each order of differential equations the result of the next highest ordered differential equations.

20. The device according to claim 19, further comprising means for applying the reduced order model in an analysis of said system.

21. A computer readable media having instructions stored thereon, said instructions, when loaded into a computer, cause the computer to perform the steps of:

generating a plurality of differential equations describing time varying components of a system;

deriving a frequency domain representation of the plurality of differential equations describing the time varying components of the system by performing a Fourier transform of the plurality of differential equations;

discretizing the frequency domain representation of the plurality of differential equations describing the response of the system; and determining an approximation of the dicretization of the frequency domain representation of the plurality of differential equations, wherein the approximation is generated by projecting onto a Krylov subspace a matrix derived from the frequency domain representation of the plurality of differential equations;

wherein:
said step of generating a plurality of differential equations further comprises determining a polynomial expansion of the plurality of differential equations and determining a plurality of ordered differential equations corresponding to the polynomial expansion of the plurality of differential equations, and said step of determining a frequency domain representation of the plurality of differential equations comprises determining a plurality of transfer functions representations each corresponding to a plurality of ordered differential equations corresponding to a polynomial expansion of the plurality of differential equations, and the step of determining the approximation comprises sequentially determining a reduced order model for each of the plurality of frequency domain representations, each reduced order model being determined by providing as the input to each order of differential equations the result of the next highest ordered differential equations.

22. A method of generating a reduced order model of a system having time varying components, comprising:

generating a plurality of differential equations describing time varying components of a system;

deriving a frequency domain representation of the plurality of differential equations describing the time varying components of the system by performing a Fourier transform of the plurality of differential equations;

discretizing the frequency domain representation of the plurality of differential equations describing the response of the system;

determining an approximation of the dicretization of the frequency domain representation of the plurality of differential equations, wherein the approximation is generated by projecting onto a Krylov subspace a matrix derived from the frequency domain representation of the plurality of differential equations; and generating a reduced order model of the system based on the approximation;

wherein the step of determining an approximation comprises the steps of,
decomposing the dicretization of the frequency domain representation of the plurality of differential equations into component matrices, multiplying the component matrices by a modulation operator matrix, and projecting the result of the multiplication of the component matrices by the modulation operator matrix to obtain the approximation.

23. A method of generating a reduced order model of a system having time varying components, comprising:

generating a plurality of differential equations describing time varying components of a system;

deriving a frequency domain representation of the plurality of differential equations describing the time varying components of the system by performing a Fourier transform of the plurality of differential equations;

discretizing the frequency domain representation of the plurality of differential equations describing the response of the system;

determining an approximation of the dicretization of the frequency domain representation of the plurality of differential equations, wherein the approximation is generated by projecting onto a Krylov subspace a matrix derived from the frequency domain representation of the plurality of differential equations; and generating a reduced order model of the system based on the approximation;

wherein the step of discretizing the frequency domain representation comprises creating a finite difference discretization of the frequency domain representation and the step of determining an approximation comprises projecting a matrix representing the finite difference discretization of the frequency domain representation onto a Krylov subspace.

* * * * *